United States Patent
Li et al.

(10) Patent No.: US 9,026,981 B2
(45) Date of Patent: *May 5, 2015

(54) DIELECTRIC RELIABILITY ASSESSMENT FOR ADVANCED SEMICONDUCTORS

(71) Applicant: International Business Machines Corporation, Armonk, NY (US)

(72) Inventors: Baozhen Li, Burlington, VT (US); James H. Stathis, Poughquag, NY (US); Ernest Y. Wu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/308,835

(22) Filed: Jun. 19, 2014

(65) Prior Publication Data

US 2014/0351785 A1 Nov. 27, 2014

Related U.S. Application Data

(63) Continuation of application No. 13/899,968, filed on May 22, 2013, now Pat. No. 8,839,180.

(51) Int. Cl.
*G06F 11/22* (2006.01)
*G06F 17/50* (2006.01)

(52) U.S. Cl.
CPC .................. *G06F 17/5081* (2013.01)

(58) Field of Classification Search
CPC . G06F 2217/10; G06F 11/2252; G06F 17/50; G06F 17/504; G06F 2217/70; G06F 17/5036; G06F 2217/12; G01R 31/31835

USPC .......... 716/106, 111, 136, 112, 113; 324/551, 324/548; 702/65, 184
See application file for complete search history.

(56) References Cited

U.S. PATENT DOCUMENTS

| | | | |
|---|---|---|---|
| 5,594,349 A * | 1/1997 | Kimura .......................... | 324/551 |
| 8,352,900 B1 * | 1/2013 | Wu ................................ | 716/136 |
| 2005/0033557 A1 * | 2/2005 | House et al. .................. | 702/184 |
| 2005/0160967 A1 * | 7/2005 | Falster et al. .................... | 117/13 |
| 2005/0184720 A1 * | 8/2005 | Bernstein et al. ............. | 324/71.1 |
| 2008/0309365 A1 * | 12/2008 | Liao et al. ...................... | 324/769 |
| 2012/0303303 A1 * | 11/2012 | Mittl et al. ....................... | 702/65 |

OTHER PUBLICATIONS

List of IBM Patents or Patent Applications Treated as Related Form; U.S. Appl. No. 13/899,968, filed May 22, 2013.

* cited by examiner

*Primary Examiner* — Brian Ngo
(74) *Attorney, Agent, or Firm* — Cantor Colburn LLP; Catherine Ivers

(57) ABSTRACT

Embodiments relate to methods, computer systems and computer program products for performing a dielectric reliability assessment for an advanced semiconductor. Embodiments include receiving data associated with a test of a macro of the advanced semiconductor to a point of dielectric breakdown. Embodiments also include scaling the data for the macro down to a reference area and extracting a parameter for a Weibull distribution from the scaled down data for the reference area. Embodiments further include deriving a cluster factor ($\alpha$) from the scaled down data for the reference area and projecting a failure rate for a larger area of the advanced semiconductor based on the extracted parameter, the cluster factor and the recorded data associated with the dielectric breakdown of the macro.

9 Claims, 5 Drawing Sheets

DIELECTRIC RELIABILITY ASSESSMENT FOR ADVANCED SEMICONDUCTORS

CROSS REFERENCE TO RELATED APPLICATIONS

This application is a continuation of the legally related U.S. application Ser. No. 13/899,968; filed May 22, 2013, which is fully incorporated herein by reference.

BACKGROUND

The present invention relates generally to reliability assessment for semiconductors, and more specifically, to dielectric reliability assessment for advanced semiconductors.

Recently, low-K dielectrics have been introduced into advanced semiconductor technologies to improve performance by reducing time-delay, noise and power dissipation. As a result of scaling of interconnect pitch, an increase in process complexities and geometric variabilities such as dielectric spacing variations, via misalignment, accurate reliability assessment of time-dependent dielectric breakdown (TDDB) has become difficult.

In contrast to traditional dielectrics, the TDDB distributions of low-K dielectrics do not always have a Weibull distribution and do not follow Poisson area scaling. In some cases, the TDDB data at very high cumulative failure percentiles do not show significant area-sensitivity. However, at low cumulative failure percentiles, the TDDB data tends to merge into a universal distribution after applying Poisson area scaling. These delirious effects have become so severe that it becomes impossible to accurately extract the time-scale and slope parameters.

Currently, in an effort to overcome these difficulties, sophisticated modeling schemes have been developed. These modeling schemes are time consuming to develop and often involve the use of several parameters. For example, in the case of variation of dielectric thickness, or spacing, a convolution-based modeling approach requires a minimum of six parameters. In most cases, the experimental work that is required to derive these sophisticated models is extremely time consuming and expensive. In addition, the methodology currently used for modeling dielectric reliability in traditional CMOS technologies is often too conservative when applied to advanced CMOS technologies, which may result in wasted time and money designing circuits attempting to satisfy this overly conservative projection.

SUMMARY

Embodiments include a computer system for performing a dielectric reliability assessment for an advanced semiconductor. The system includes a processor configured to communicate with a memory and one or more auxiliary storage devices, the processor configured to perform a method. The method includes receiving data associated with a test of a macro of the advanced semiconductor to a point of dielectric breakdown. The method also includes scaling the data for the macro down to a reference area and extracting a parameter for a Weibull distribution from the scaled down data for the reference area. The method further includes deriving a cluster factor ($\alpha$) from the scaled down data for the reference area; and projecting a failure rate for a larger area of the advanced semiconductor based on the extracted parameter, the cluster factor and the recorded data associated with the dielectric breakdown of the macro.

Embodiments also include a computer implemented method for performing a dielectric reliability assessment for an advanced semiconductor. The method includes receiving data associated with a test of a macro of the advanced semiconductor to a point of dielectric breakdown. The method also includes scaling the data for the macro down to a reference area and extracting a parameter for a Weibull distribution from the scaled down data for the reference area. The method further includes deriving a cluster factor ($\alpha$) from the scaled down data for the reference area; and projecting a failure rate for a larger area of the advanced semiconductor based on the extracted parameter, the cluster factor and the recorded data associated with the dielectric breakdown of the macro.

Embodiments further include a computer program product for performing a dielectric reliability assessment for an advanced semiconductor, the computer program product including a tangible storage medium readable by a processing circuit and storing instructions for execution by the processing circuit for performing a method. The method includes receiving data associated with a test of a macro of the advanced semiconductor to a point of dielectric breakdown. The method also includes scaling the data for the macro down to a reference area and extracting a parameter for a Weibull distribution from the scaled down data for the reference area. The method further includes deriving a cluster factor ($\alpha$) from the scaled down data for the reference area; and projecting a failure rate for a larger area of the advanced semiconductor based on the extracted parameter, the cluster factor and the recorded data associated with the dielectric breakdown of the macro.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

In exemplary embodiments, methods, systems and computer program products for performing dielectric reliability assessment for advanced semiconductors are provided. In exemplary embodiments, a time-dependent clustering model for non-uniform dielectric breakdown is utilized for assessing the dielectric reliability of a advance semiconductor device. In exemplary embodiments, the time-dependent clustering model includes Weibull parameters and a clustering factor that are extracted from measured TDDB distributions in the semiconductor device.

Figure 1:
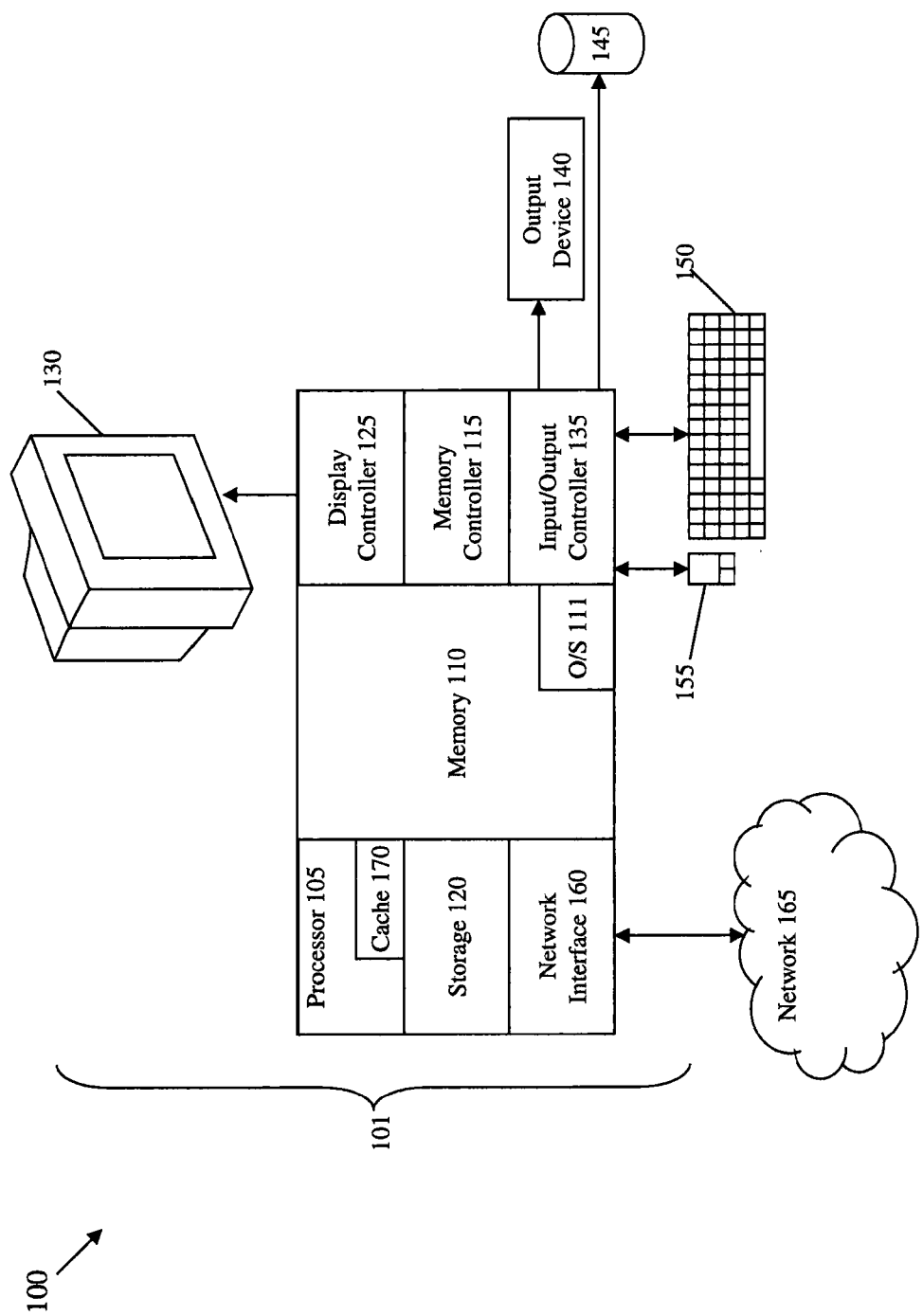
FIG. 1 illustrates a block diagram of an exemplary embodiment of a computer system for practicing the teachings herein.

FIG. 1 illustrates a block diagram of an exemplary computer system 100 for use with the teachings herein. The methods described herein can be implemented in hardware software (e.g., firmware), or a combination thereof. In an exemplary embodiment, the methods described herein are implemented in hardware, and is part of the microprocessor of a special or general-purpose digital computer, such as a personal computer, workstation, minicomputer, or mainframe computer. The system 100 therefore includes general-purpose computer 101.

In an exemplary embodiment, in terms of hardware architecture, as shown in FIG. 1, the computer 101 includes a processor 105, memory 110 coupled via a memory controller 115, a storage device 120, and one or more input and/or output (I/O) devices 140, 145 (or peripherals) that are communicatively coupled via a local input/output controller 135. The input/output controller 135 can be, for example, but not limited to, one or more buses or other wired or wireless connections, as is known in the art. The input/output controller 135 may have additional elements, which are omitted for simplicity, such as controllers, buffers (caches), drivers, repeaters, and receivers, to enable communications. Further, the local interface may include address, control, and/or data connections to enable appropriate communications among the aforementioned components. The storage device 120 may include one or more hard disk drives (HDD), solid state drives (SSD), or any other suitable form of storage.

The processor 105 is a computing device for executing hardware instructions or software, particularly that stored in memory 110. The processor 105 can be any custom made or commercially available processor, a central processing unit (CPU), an auxiliary processor among several processors associated with the computer 101, a semiconductor based microprocessor (in the form of a microchip or chip set), a macroprocessor, or generally any device for executing instructions. The processor 105 may include a cache 170, which may be organized as a hierarchy of more cache levels (L1, L2, etc.).

The memory 110 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 110 may incorporate electronic, magnetic, optical, and/or other types of storage media. Note that the memory 110 can have a distributed architecture, where various components are situated remote from one another, but can be accessed by the processor 105.

The instructions in memory 110 may include one or more separate programs, each of which comprises an ordered listing of executable instructions for implementing logical functions. In the example of FIG. 1, the instructions in the memory 110 include a suitable operating system (OS) 111. The operating system 111 essentially controls the execution of other computer programs and provides scheduling, input-output control, file and data management, memory management, and communication control and related services.

In an exemplary embodiment, a conventional keyboard 150 and mouse 155 can be coupled to the input/output controller 135. Other output devices such as the I/O devices 140, 145 may include input devices, for example but not limited to a printer, a scanner, microphone, and the like. Finally, the I/O devices 140, 145 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 100 can further include a display controller 125 coupled to a display 130. In an exemplary embodiment, the system 100 can further include a network interface 160 for coupling to a network 165. The network 165 can be an IP-based network for communication between the computer 101 and any external server, client and the like via a broadband connection. The network 165 transmits and receives data between the computer 101 and external systems. In an exemplary embodiment, network 165 can be a managed IP network administered by a service provider. The network 165 may be implemented in a wireless fashion, e.g., using wireless protocols and technologies, such as Wi-Fi, WiMax, etc. The network 165 can also be a packet-switched network such as a local area network, wide area network, metropolitan area network, Internet network, or other similar type of network environment. The network 165 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 101 is a PC, workstation, intelligent device or the like, the instructions in the memory 110 may further include a basic input output system (BIOS) (omitted for simplicity). The BIOS is a set of essential routines that initialize and test hardware at startup, start the OS 111, and support the transfer of data among the storage devices. The BIOS is stored in ROM so that the BIOS can be executed when the computer 101 is activated.

When the computer 101 is in operation, the processor 105 is configured to execute instructions stored within the memory 110, to communicate data to and from the memory 110, and to generally control operations of the computer 101 pursuant to the instructions.

Generally, Poisson modelling assumes that defects are uniformly distributed across an area of a chip or die. However, it is well known that defects tend to occur in clusters rather than being uniformly distributed. In order to account for this non-uniform distribution of defects, a negative binomial yield model can be represented as:

$$Y = 1 - F = \left(1 + \frac{\lambda}{\alpha}\right)^{-\alpha} = \left(1 + \frac{AD}{\alpha}\right)^{-\alpha}$$

where Y is the yield, F is the cumulative failure probability, $\lambda$ is the average number of defects for an area A, D is the average defect density, and $\alpha$ is a clustering factor which describes the extent of defect non-uniformity. In exemplary embodiments, as $\alpha$ increases to $\infty$, the negative binomial yield model approaches a Poisson model:

$$Y = 1 - F = \exp(-\lambda) = \exp(-AD).$$

In exemplary embodiments, the data used for reliability assessment of dielectric breakdown is collected at test structures, which are small areas of a chip or die. Based on the collected data, a projection of the number of failures in a much larger area of the chip or die made. Assuming a constant defect density (D), the area transformation of cumulative failure distributions, $F_1$ and $F_2$, of any two different areas of $A_2$ and $A_1$ for negative binomial distribution is:

$$1 - F_2 = \left\{1 + \frac{A_2}{A_1}((1-F_1)^{-1/\alpha} - 1)\right\}^{-\alpha}.$$

At low cumulative failure percentiles, where $F_1 \ll 1$, the above equation can be mathematically shown to be:

$$1 - F_2 \cong \left\{1 + \frac{A_2 F_1}{A_1 \alpha}\right\}^{-\alpha} \cong (1 - F_1)^{\frac{A_2}{A_1}}$$

Accordingly, at low cumulative failure percentiles, the defect distributions become uniform in contrast to non-uniform defect distribution at high cumulative failure percentiles. In other words, at sufficiently small probabilities, failures arise from uniformly distributed defects rather than clustered defects.

In yield modelling, uniform or non-uniform defect distributions are considered in spatial context by Poisson and negative binomial distributions, respectively. In the temporal context for dielectric breakdown, the average number of defects for area ($\lambda$) can be replaced by a time-dependent variable, $(t/\tau)^\beta$. Accordingly, a time-dependent clustering model in the form of negative binomial distribution can be represented as:

$$F(t) = 1 - \left(1 + \frac{1}{\alpha}\left(\frac{t}{\tau}\right)^\beta\right)^{-\alpha}$$

where $\alpha$ is the clustering factor, $\tau$ is a scale parameter and $\beta$ is a shape parameter. As $\alpha$ approaches $\infty$, the negative binomial distribution approaches a Weibull distribution, where $\tau$ represents the usual time-to-failure at 63% and $\beta$ represents a Weibull slope of low-percentile portion of the distribution or in the absence of clustering effect.

Figure 2A:
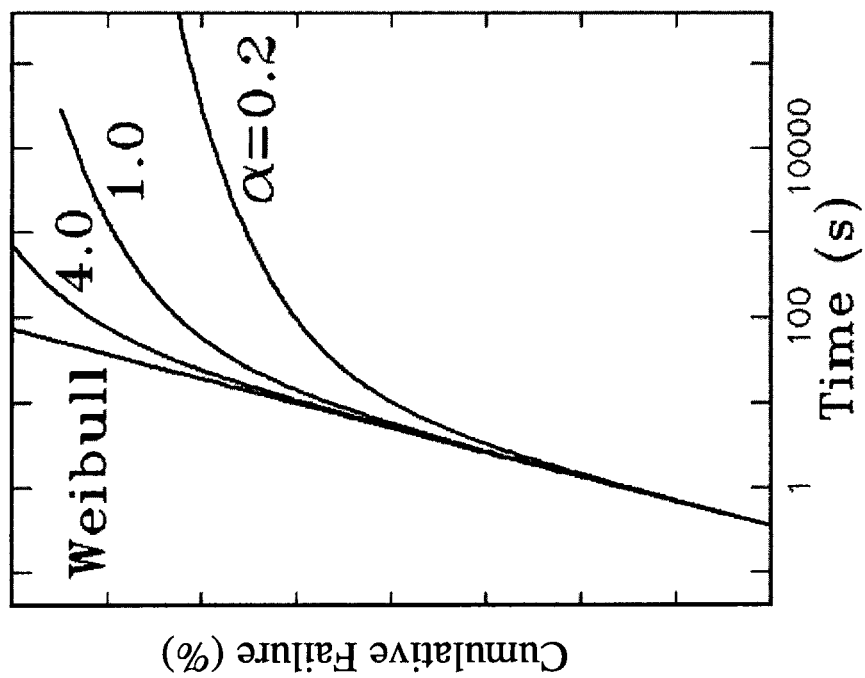
FIGS. 2A and 2B illustrate graphs that respectively show the effects of clustering factor ($\alpha$) and shape parameter ($\beta$) on a the time-dependant clustering model in accordance with an exemplary embodiment.
Figure 2B:
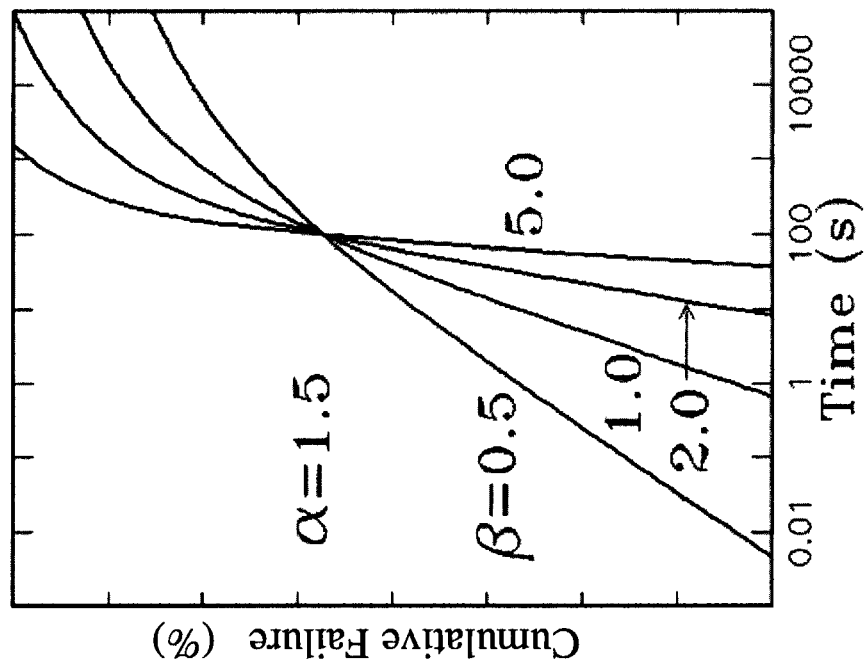

Referring now to FIGS. 2A and 2B, graphs illustrating the effects of clustering factor ($\alpha$) and shape parameter ($\beta$) on the time-dependant clustering model are respectively shown. In exemplary embodiments, a smaller clustering factor ($\alpha$) value is an indication of stronger defect clustering. Accordingly, as illustrated in FIG. 2A, a decrease in clustering factor ($\alpha$) causes the distribution to bend downward when clustering effect becomes stronger. Consequently, the cumulative failure decrease with decreasing clustering factors at a fixed time as shown in FIG. 2A.

At low failure percentiles the failure time distributions approach the straight line of the Weibull distribution. Therefore, since Weibull distribution is a good approximation at low failure rate percentiles, the scaling of the characteristic times of any two different areas can be done performed by:

$$\tau_2(A_2) = \tau_1(A_1)\left(\frac{A_1}{A_2}\right)^{1/\beta}.$$

Figure 3:
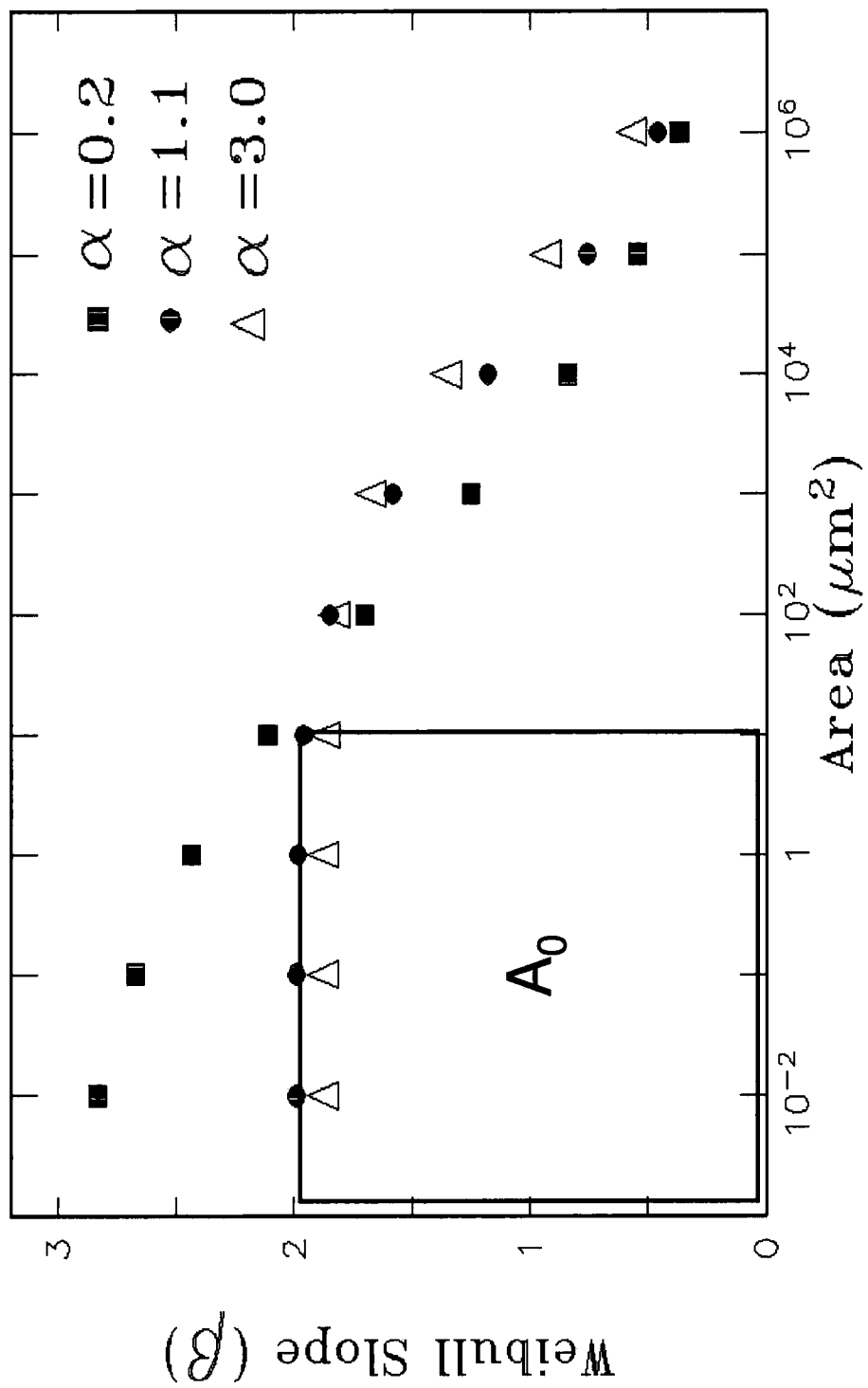
FIG. 3 illustrates a graph showing the relationship between a Weibull shape factor ($\beta$) and a size of a test area of a advanced semiconductor.

Referring now to FIG. 3, a graph illustrating the relationship between the Weibull shape factor ($\beta$) and a size of a test area of an advanced semiconductor device is shown. In exemplary embodiments, given a sufficiently high clustering factor ($\alpha$) as the size of a reference area ($A_0$) decreases, the Weibull shape factor ($\beta$) saturates, or becomes constant. In exemplary embodiments, the Weibull shape factor ($\beta$) is selected to be the constant value. For example, in the illustrated example of FIG. 3, $\beta=2$. In exemplary embodiments, the clustering factor ($\alpha$) is selected to be the smallest clustering factor ($\alpha$) at which the Weibull shape factor ($\beta$) saturates. For example, in the illustrated example of FIG. 3, $\alpha=1.1$.

Figure 4:
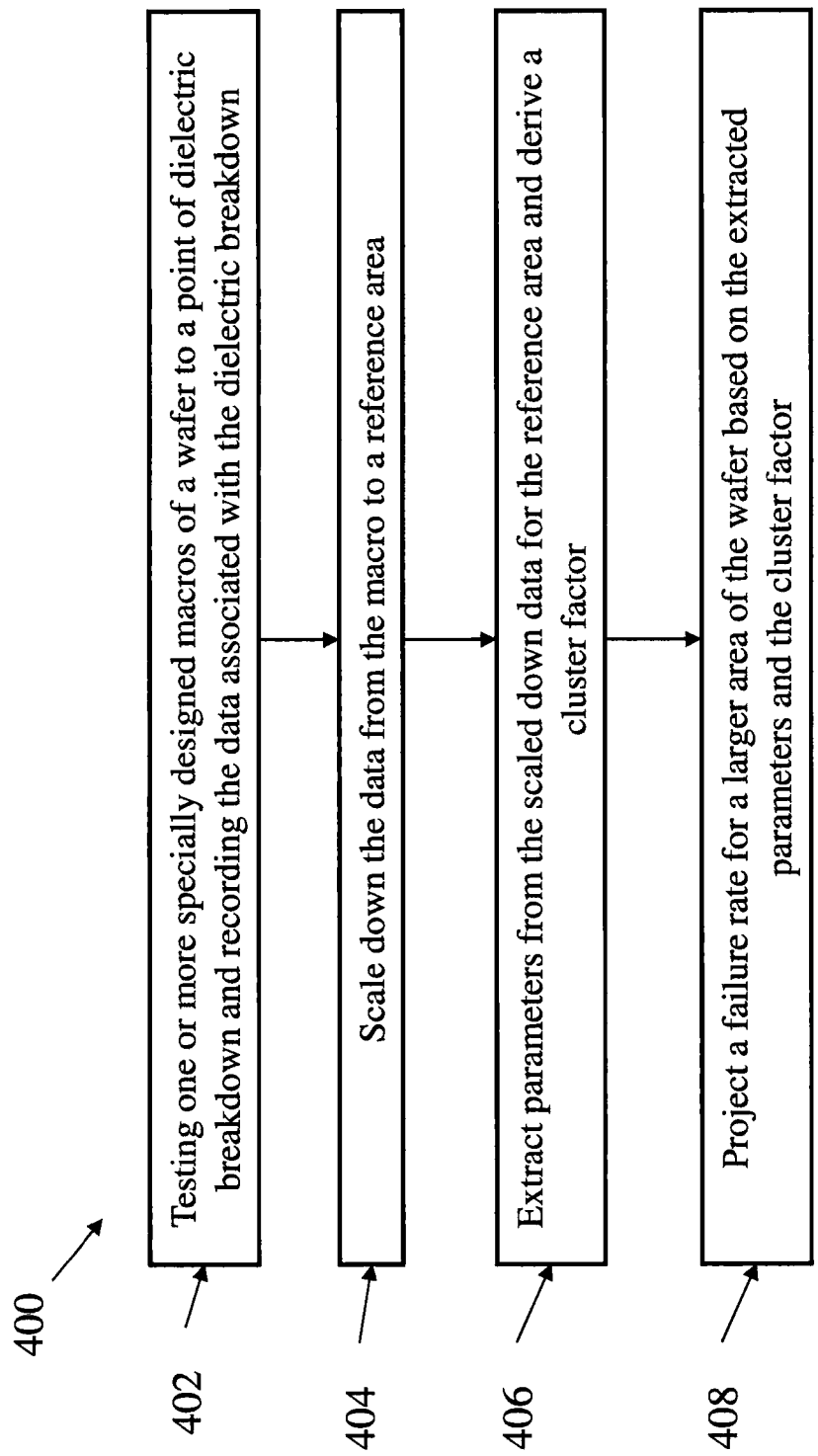
FIG. 4 illustrates a process flow of a method for dielectric reliability assessment for advanced semiconductors in accordance with an exemplary embodiment.

Referring now to FIG. 4, a process flow for a method 400 of dielectric reliability assessment for advanced semiconductors in accordance with an exemplary embodiment is shown. As shown at block 402, the method 400 begins by testing one or more specially designed macros, or portions of a die or a die ($A_1$), to a point of dielectric breakdown and recording the data associated with the dielectric breakdown. In exemplary embodiments, the testing may include using voltage, current and/or temperature for acceleration of the dielectric breakdown. Next, as shown at block 404, the data for the macro is scaled down to a reference area ($A_0$). In exemplary embodiments, the reference area ($A_0$) is selected to be small enough such that the failure times associated with the reference area is accurately represented by a Weibull distribution. Next, as shown at block 406, the parameters for the Weibull distribution of the reference area ($A_0$) are extracted and a cluster factor ($\alpha$) is derived. In exemplary embodiments, the parameters for the Weibull distribution include both a Weibull shape factor ($\beta$) and scale factor ($\tau$). In exemplary embodiments, the following equation is used to extract the Weibull distribution parameters and extract the cluster factor:

$$F = 1 - \left(1 + \frac{1}{\alpha}\left(\frac{t}{\tau}\right)^\beta\right)^{-\alpha}.$$

Continuing with reference to FIG. 4, as shown at block 408, the method 400 includes projecting a failure rate for a larger area of a die or a die based on the extracted Weibull distribution parameters and the cluster factor. In exemplary embodiments, the projection is made using the following formula:

$$1 - F_2 \cong \left\{1 + \frac{A_2 F_1}{A_1 \alpha}\right\}^{-\alpha} \cong (1 - F_1)^{\frac{A_2}{A_1}}$$

where $A_1$ is the size of the tested macro, $A_2$ is a larger area of the die or die, $F_1$ is the cumulative failure of the tested macro, and $F_2$ is the cumulative failure of the area corresponding to $A_2$.

Figure 5:
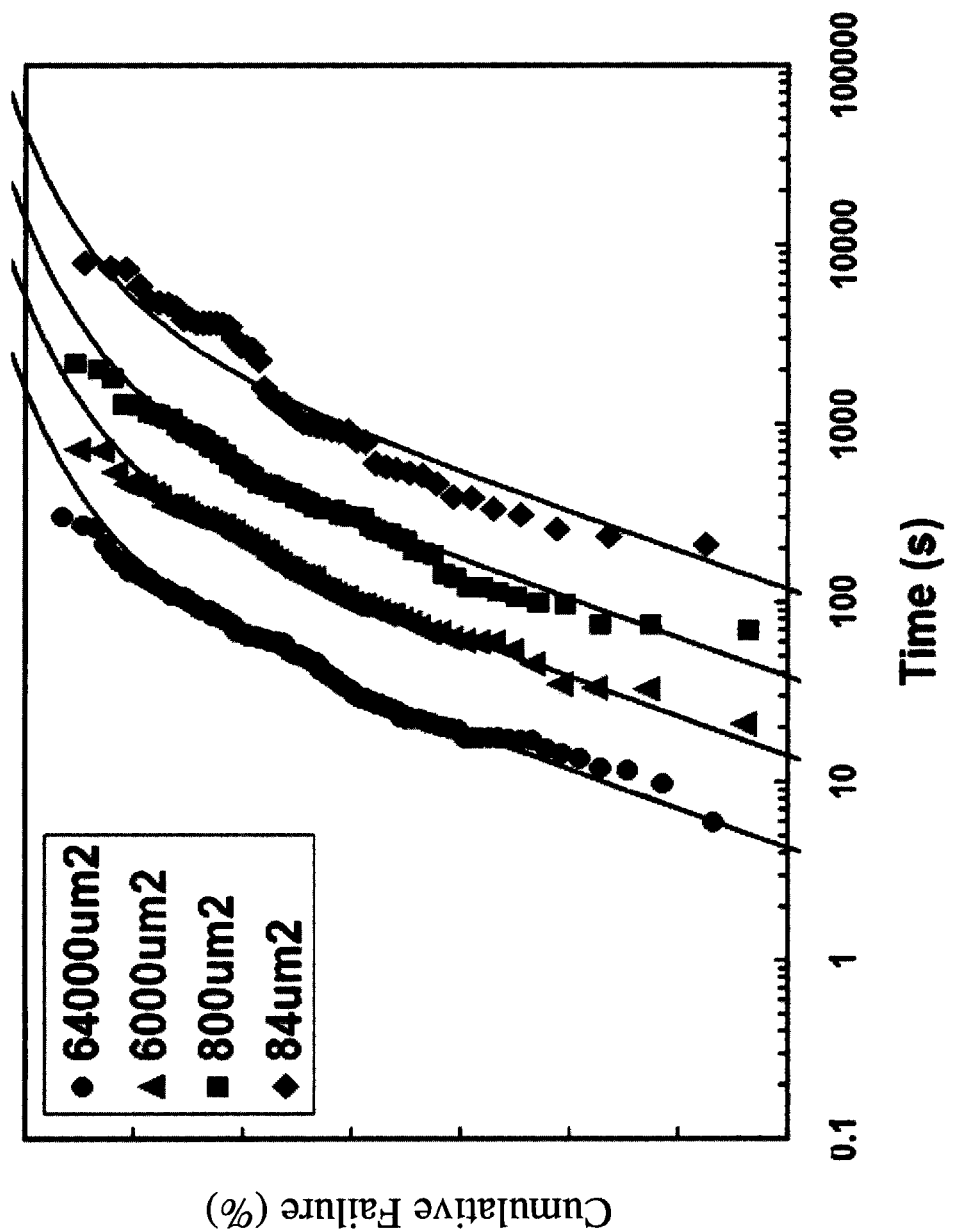
FIG. 5 illustrates a graph depicting a correlation between a time-dependent clustering model in accordance with exemplary embodiment and experimental data.

Referring now to FIG. 5, a graph illustrating a comparison between the time-dependent clustering model, shown as lines, and experimental data, shown as icons, is depicted. While at earlier times the reasonable area scaling is evident, at late times the cumulative failures from three areas converge to each other and shows nearly area-independence. These features of experimental data are well captured by the time-dependent clustering model. It is evident that the transformed data using Poisson model do not converge to a straight line, demonstrating the defects are non-uniformly distributed. In contrast, the results using the clustering model not only overlay well with the data but also form a straight line as predicted, which indicates that the clustering model restores the weakest-link property at low percentiles when the clustering effect diminishes. In addition, this recovery of Poisson area scaling at sufficiently small areas offers a means to directly extract two parameters ($\tau$ and $\beta$) without explicitly involving clustering factor, $\alpha$.

While Weibull distribution is used here to exemplify the applications of the clustering model and derivation of the model parameters, other distributions, including Lognormal, Gumbel, Extreme Value, may be used as well. Though the focus here is the dielectric reliability assessment with clustering model, the clustering model can also be used in other reliability assessments for defect generated wear out failures.

As will be appreciated by one skilled in the art, one or more aspects of the present invention may be embodied as a system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Program code, when created and stored on a tangible medium (including but not limited to electronic memory modules (RAM), flash memory, Compact Discs (CDs), DVDs, Magnetic Tape and the like is often referred to as a "computer program product". The computer program product medium is typically readable by a processing circuit preferably in a computer system for execution by the processing circuit. Such program code may be created using a compiler or assembler for example, to assemble instructions, that, when executed perform aspects of the invention.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments are described above with reference to flowchart illustrations and/or schematic diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer implemented method for performing a dielectric reliability assessment for an advanced semiconductor, the method comprising:
  receiving data associated with a test of a macro of the advanced semiconductor to a point of dielectric breakdown;
  scaling, by a processor, the data for the macro down to a reference area;
  extracting a parameter for a Weibull distribution from the scaled down data for the reference area;
  deriving a cluster factor ($\alpha$) from the scaled down data for the reference area; and
  projecting a failure rate for a larger area of the advanced semiconductor based on the extracted parameter, the cluster factor and the recorded data associated with the dielectric breakdown of the macro,
  wherein the parameter include a Weibull shape factor ($\beta$) and scale factor ($\tau$) and wherein the Weibull shape factor ($\beta$), the scale factor ($\tau$) and the clustering factor ($\alpha$) are extracted according to:

$$F = 1 - \left(1 + \frac{1}{\alpha}\left(\frac{t}{\tau}\right)^{\beta}\right)^{-\alpha}.$$

2. The computer implemented method of claim 1, wherein the testing includes using voltage and current for acceleration of the dielectric breakdown.

3. The computer implemented method of claim 1, wherein a size of the reference area is selected to be small enough that failure time data for the reference area is accurately represented by a Weibull distribution.

4. A computer program product for performing a dielectric reliability assessment for an advanced semiconductor, the computer program product comprising:
  a non-transitory tangible storage medium readable by a processing circuit and storing instructions for execution by the processing circuit for performing a method comprising:
  receiving data associated with a test of a macro of the advanced semiconductor to a point of dielectric breakdown;
  scaling the data for the macro down to a reference area;
  extracting a parameter for a Weibull distribution from the scaled down data for the reference area;
  deriving a cluster factor ($\alpha$) from the scaled down data for the reference area; and
  projecting a failure rate for a larger area of the advanced semiconductor based on the extracted parameter, the cluster factor and the recorded data associated with the dielectric breakdown of the macro,
  wherein the parameter include a Weibull shape factor ($\beta$) and scale factor ($\tau$) and wherein the Weibull shape factor ($\beta$), the scale factor ($\tau$) and the clustering factor ($\alpha$) are extracted according to:

$$F = 1 - \left(1 + \frac{1}{\alpha}\left(\frac{t}{\tau}\right)^{\beta}\right)^{-\alpha}.$$

5. The computer program product of claim 4, wherein the testing includes using voltage and current for acceleration of the dielectric breakdown.

6. The computer program product of claim 4, wherein a size of the reference area is selected to be small enough that failure time data for the reference area is accurately represented by a Weibull distribution.

7. A computer system for performing a dielectric reliability assessment for an advanced semiconductor, the system comprising:
  a processor configured to communicate with a memory and one or more auxiliary storage devices, the processor configured to perform a method comprising:
  receiving data associated with a test of a macro of the advanced semiconductor to a point of dielectric breakdown;
  scaling the data for the macro down to a reference area;
  extracting a parameter for a Weibull distribution from the scaled down data for the reference area;
  deriving a cluster factor ($\alpha$) from the scaled down data for the reference area; and
  projecting a failure rate for a larger area of the advanced semiconductor based on the extracted parameter, the cluster factor and the recorded data associated with the dielectric breakdown of the macro,
  wherein the parameter include a Weibull shape factor ($\beta$) and scale factor ($\tau$) and wherein the Weibull shape factor ($\beta$), the scale factor ($\tau$) and the clustering factor ($\alpha$) are extracted according to:

$$F = 1 - \left(1 + \frac{1}{\alpha}\left(\frac{t}{\tau}\right)^{\beta}\right)^{-\alpha}.$$

8. The computer system of claim 7, wherein the testing includes using voltage and current for acceleration of the dielectric breakdown.

9. The computer system of claim 7, wherein a size of the reference area is selected to be small enough that failure time data for the reference area is accurately represented by a Weibull distribution.

* * * * *